(12) United States Patent
Choi et al.

(10) Patent No.: US 10,416,705 B2
(45) Date of Patent: Sep. 17, 2019

(54) TRAINING DEVICE AND SEMICONDUCTOR SYSTEM INCLUDING THE SAME

(71) Applicant: SK hynix Inc., Icheon-si, Gyeonggi-do (KR)

(72) Inventors: Geun Ho Choi, Icheon-si (KR); Hyeong Soo Jeong, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 197 days.

(21) Appl. No.: 15/642,731

(22) Filed: Jul. 6, 2017

(65) Prior Publication Data

US 2018/0150100 A1    May 31, 2018

(30) Foreign Application Priority Data

Nov. 29, 2016 (KR) .................. 10-2016-0160416

(51) Int. Cl.
  *G06F 1/10*  (2006.01)
  *G06F 1/12*  (2006.01)
  *G11C 7/10*  (2006.01)
  *G11C 11/4093*  (2006.01)
  *G11C 11/4096*  (2006.01)

(52) U.S. Cl.
  CPC ............... *G06F 1/12* (2013.01); *G06F 1/10* (2013.01); *G11C 7/106* (2013.01); *G11C 7/1087* (2013.01); *G11C 11/4093* (2013.01); *G11C 7/1066* (2013.01); *G11C 7/1093* (2013.01); *G11C 11/4096* (2013.01); *G11C 2207/107* (2013.01)

(58) Field of Classification Search
  CPC .............................. G06F 1/10; G11C 7/1066
  See application file for complete search history.

(56) References Cited

U.S. PATENT DOCUMENTS

2006/0158238 A1  7/2006  Jung
2008/0256282 A1*  10/2008  Guo ............... G06F 13/4239
                                                                710/305
2013/0315014 A1  11/2013  Dearth et al.

* cited by examiner

*Primary Examiner* — Albert Wang
(74) *Attorney, Agent, or Firm* — William Park & Associates Ltd.

(57) ABSTRACT

A training device may include a pattern generation circuit configured to generate a pattern signal in response to a read command, a delay calculation circuit configured to calculate a delay amount based on comparison results between a generation timing of the pattern signal and generation timings of pattern signals which are generated from one or more other training devices and transmitted to a corresponding training device, and a delay adjusting circuit configured to adjust a delay of a DQ signal in a chip including the corresponding training device, based on the delay amount.

20 Claims, 13 Drawing Sheets

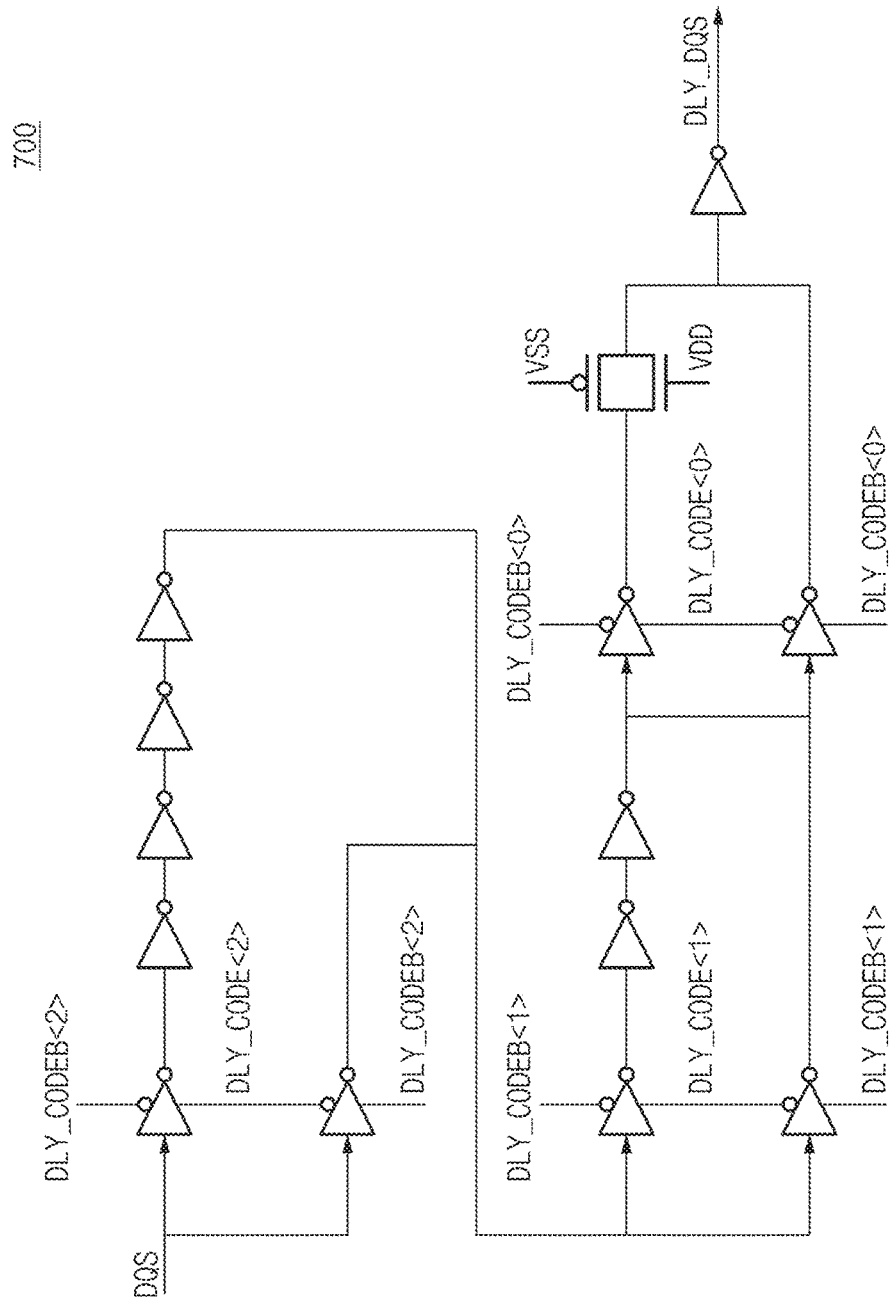

TRAINING DEVICE AND SEMICONDUCTOR SYSTEM INCLUDING THE SAME

CROSS-REFERENCES TO RELATED APPLICATION

The present application claims priority under 35 U.S.C. § 119(a) to Korean application number 10-2016-0160416, filed on Nov. 29, 2016, in the Korean Intellectual Property Office, which is incorporated herein by reference in its entirety.

BACKGROUND

1. Technical Field

Various embodiments relate to a training device and a semiconductor system including the same, and more particularly, to a technique for adjusting delays of a plurality of data input/output terminals.

2. Related Art

Recently, more and more devices in various fields use a large amount of data to process images or accommodate sizable data. In order to process a large amount of data, it is important to increase the capacity of a semiconductor device while improving data processing speed. Thus, a semiconductor device such as DRAM includes a plurality of chips to increase its capacity.

However, the plurality of chips may have different delays during data input/output, due to an error in processing or the like. In this case, an error may occur during communication between an external device and the semiconductor device.

FIG. 10A is a timing diagram of data according to the related art. FIG. 10A is based on the supposition that a semiconductor device includes three chips CS0 to CS2, read commands READ_CS0 to READ_CS2 are inputted to the respective chips CS0 to CS2 on a four-clock basis, and the chips CS0 to CS2 output data DATA_CS0 to DATA_CS2 having a burst length of eight bits, respectively.

Referring to FIG. 10A, a delay time tDQSCK0 of the chip CS0, a delay time tDQSCK1 of the chip CS1, and a delay time tDQSCK2 of the chip CS2 are different from each other. At this time, tDQSCK represents a value indicating a skew between a clock signal and a data strobe signal, i.e. DQS signal.

Therefore, when the data DATA_CS0 to DATA_CS2 generated by the respective chips CS0 to CS2 are outputted through a common DQ terminal, a separation or overlap between the data DATA_CS0 to DATA_CS2, that is, a read bubble may occur in the DQ signal outputted through the DQ terminal.

SUMMARY

Various embodiments are directed to a technique for adjusting a delay between chips during a data output operation of a semiconductor device including a plurality of chips.

In an embodiment of the present disclosure, a training device may include: a pattern generation circuit configured to generate a pattern signal in response to a read command; a delay calculation circuit configured to calculate a delay amount based on comparison results between a generation timing of the pattern signal and generation timings of pattern signals which are generated from one or more other training devices and transmitted to a corresponding training device; and a delay adjusting circuit configured to adjust a delay of a DQ signal in a chip including the corresponding training device, based on the delay amount.

In an embodiment of the present disclosure, a semiconductor system may include: a control device configured to generate a read command; and a semiconductor device including a plurality of chips to which a plurality of DQ lines are connected in common. Each of the chips may include a training device configured to generate and transmit a pattern signal to one or more other chips in response to the read command, calculate a delay amount based on comparison results between a generation timing of the pattern signal generated by the corresponding chip and generation timings of pattern signals which are generated by the other chips, and adjust delays of DQ signals transmitted from the other chips, based on the delay amount.

BRIEF DESCRIPTION OF THE DRAWINGS

Features, aspects, and embodiments are described in conjunction with the attached drawings, in which:

FIG. 9 is a diagram illustrating a delay adjusting circuit of FIG. 4, when a delay code is constituted by three bits;

DETAILED DESCRIPTION

Hereinafter, a training device and a semiconductor system including the same according to the present disclosure will be described below with reference to the accompanying drawings through exemplary embodiments.

First, referring to FIGS. 1 to 3, a schematic configuration of a semiconductor system 1 according to an embodiment will be described.

Figure 1:
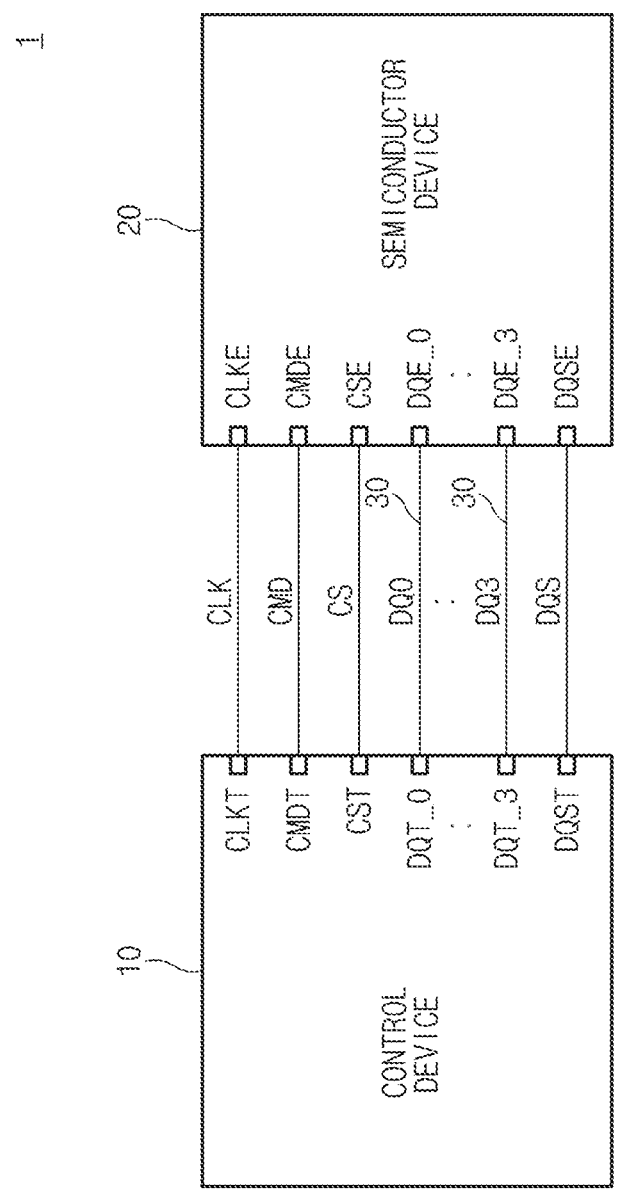
FIG. 1 is a schematic configuration diagram of a semiconductor system according to an embodiment.

FIG. 1 is a schematic configuration diagram of the semiconductor system 1 according to the present embodiment.

Referring to FIG. 1, the semiconductor system 1 includes a control device 10 and a semiconductor device 20.

The control device 10 may transmit various control signals such as a clock signal CLK, a command signal CMD and a chip select signal CS to the semiconductor device 20, and includes a memory controller or application processor, for example.

The control device 10 includes a clock terminal CLKT, a command terminal CMDT, a chip select signal terminal CST, a plurality of DQ terminals DQT_0 to DQT_3, and a DQS terminal DQST. The semiconductor device 20 includes external terminals corresponding to the respective terminals of the control device 10, that is, an external clock terminal CLKE, an external command terminal CMDE, an external chip select signal terminal CSE, a plurality of external DQ terminals DQE0 to DQE3, and an external DQS terminal DQSE.

As illustrated in FIG. 1, the control device 10 transmits various commands CMD to the external command terminal CMDE of the semiconductor device 20 through the command terminal CMDT. The semiconductor device 20 may include a plurality of chips CHIP0 to CHIP3 to which a plurality of DQ lines 30 are connected in common. The control device 10 may simultaneously transmit a chip select signal CS through the chip select signal terminal CST in order to indicate to which one of chips CHIP0 to CHIP3 in the semiconductor device 20 a transmitted command CMD corresponds. The semiconductor device 20 receives the chip select signal CS through the external chip select signal terminal CSE. FIG. 1 illustrates only one terminal through which the chip select signal CS is transmitted. As illustrated in FIG. 2, however, a multi-bit chip select signal CS may be transmitted through a plurality of chip select signal terminals CST0 to CST3 and CSE0 to CSE3.

The control device 10 transmits/receives a plurality of DQ signals DQ0 to DQ3, i.e. data signals, through the plurality of DQ terminals DQT_0 to DQT_3. The semiconductor device 20 transmits/receives the plurality of DQ signals DQ0 to DQ3 through the plurality of external DQ terminals DQE_0 to DQE_3. FIG. 1 illustrates that the semiconductor system 1 includes four DQ terminals DQT_0 to DQT_3 and four external DQ terminals DQE_0 to DQE_3 and four DQ signals DQ0 to DQ3 which are transmitted/received. However, the numbers of DQ terminals DQT_0 to DQT_3, external DQ terminals DQE_0 to DQE_3, and DQ signals DQ0 to DQ3 are not limited thereto.

The control device 10 transmits/receives a DQS signal through the DQS terminal DQST. The semiconductor device 20 transmits/receives the DQS signal through the external DQS terminal DQSE. The DQS signal DQS is transmitted with each of the DQ signals DQ0 to DQ3, in order to indicate a point of time that the DQ signal DQ is transmitted.

The control device 10 transmits the clock signal CLK through the clock terminal CLKT. The semiconductor device 20 receives the clock signal CLK through the external clock terminal CLKE.

Figure 2:
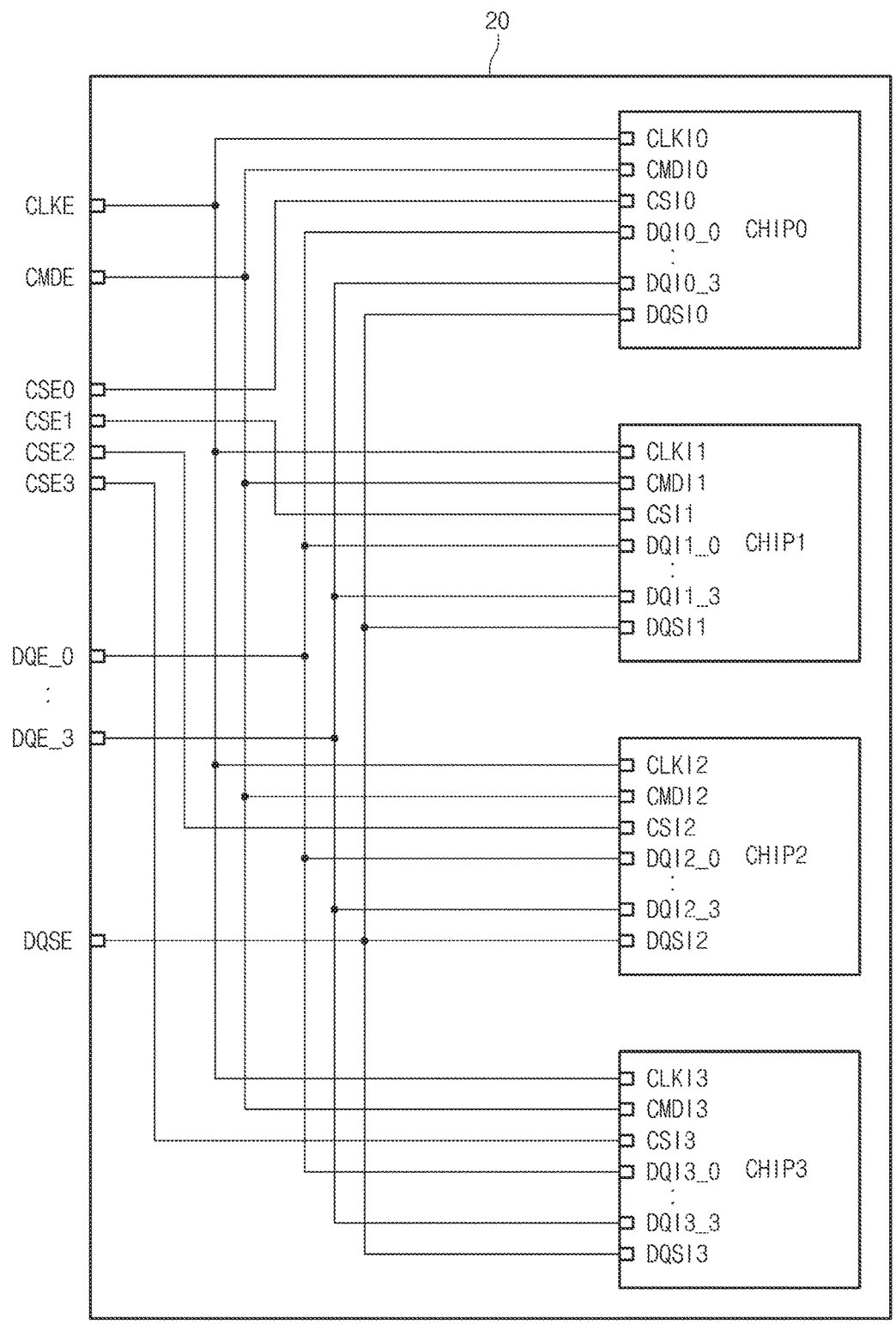
FIG. 2 is a diagram illustrating a connection relation between external terminals and internal terminals of a semiconductor device of FIG. 1.

FIG. 2 is a diagram illustrating a connection relation between the external terminals and internal terminals of the semiconductor device 20 of FIG. 1.

Referring to FIG. 2, the semiconductor device 20 includes a plurality of chips CHIP0 to CHIP3. FIG. 2 illustrates that the semiconductor device 20 includes four chips CHIP0 to CHIP3, for convenience of description. However, the number of chips included in the semiconductor device 20 is not limited thereto.

Each of the chips CHIP0 to CHIP3 includes internal terminals corresponding to the respective external terminals CLKE, CMDE, CSE, DQE_0~DQE_3 and DQSE. Specifically, the first chip CHIP0 includes a first internal clock terminal CLKI0, a first internal command terminal CMDI0, a first internal chip select signal terminal CSI0, a plurality of first internal DQ terminals DQI0_0 to DQI0_3, and a first internal DQS terminal DQSI0. The second chip CHIP1 includes a second internal clock terminal CLKI1, a second internal command terminal CMDI1, a second internal chip select signal terminal CSI1, a plurality of second internal DQ terminals DQI1_0 to DQI1_3, and a second internal DQS terminal DQSI1. The third chip CHIP2 includes a third internal clock terminal CLKI2, a third internal command terminal CMDI2, a third internal chip select signal terminal CSI2, a plurality of third internal DQ terminals DQI2_0 to DQI2_3, and a third internal DQS terminal DQSI2. The fourth chip CHIP3 includes a fourth internal clock terminal CLKI3, a fourth internal command terminal CMDI3, a fourth internal chip select signal terminal CSI3, a plurality of fourth internal DQ terminals DQI3_0 to DQI3_3, and a fourth internal DQS terminal DQSI3.

In the semiconductor device 20, the external terminals are connected to the corresponding internal terminals. That is, the external clock terminal CLKE is connected to the first to fourth internal clock terminals CLKI0 to CLKI3, the external command terminal CMDE is connected to the first to fourth internal command terminals CMDI0 to CMDI3, the external DQ terminals DQE_0, DQE_1, DQE_2, and DQE_3 are connected to the first to fourth internal DQ terminals DQI0_0~DQI3_0, DQI0_1~DQI3_1, DQI0_2~DQI3_2, and DQI0_3~DQI3_3, respectively, and the external DQS terminal DQSE is connected to the first to fourth internal DQS terminals DQSI0 to DQSI3.

However, the external chip select signal terminals CSE0 to CSE3 may be connected to the internal chip select signal terminals CSI0 to CSI3, respectively. Thus, when a specific external chip select signal is enabled, only the chip corresponding to the external chip select signal may receive the command signal CMD, the DQ signals DQ_0 to DQ_3 and the like.

Figure 3:
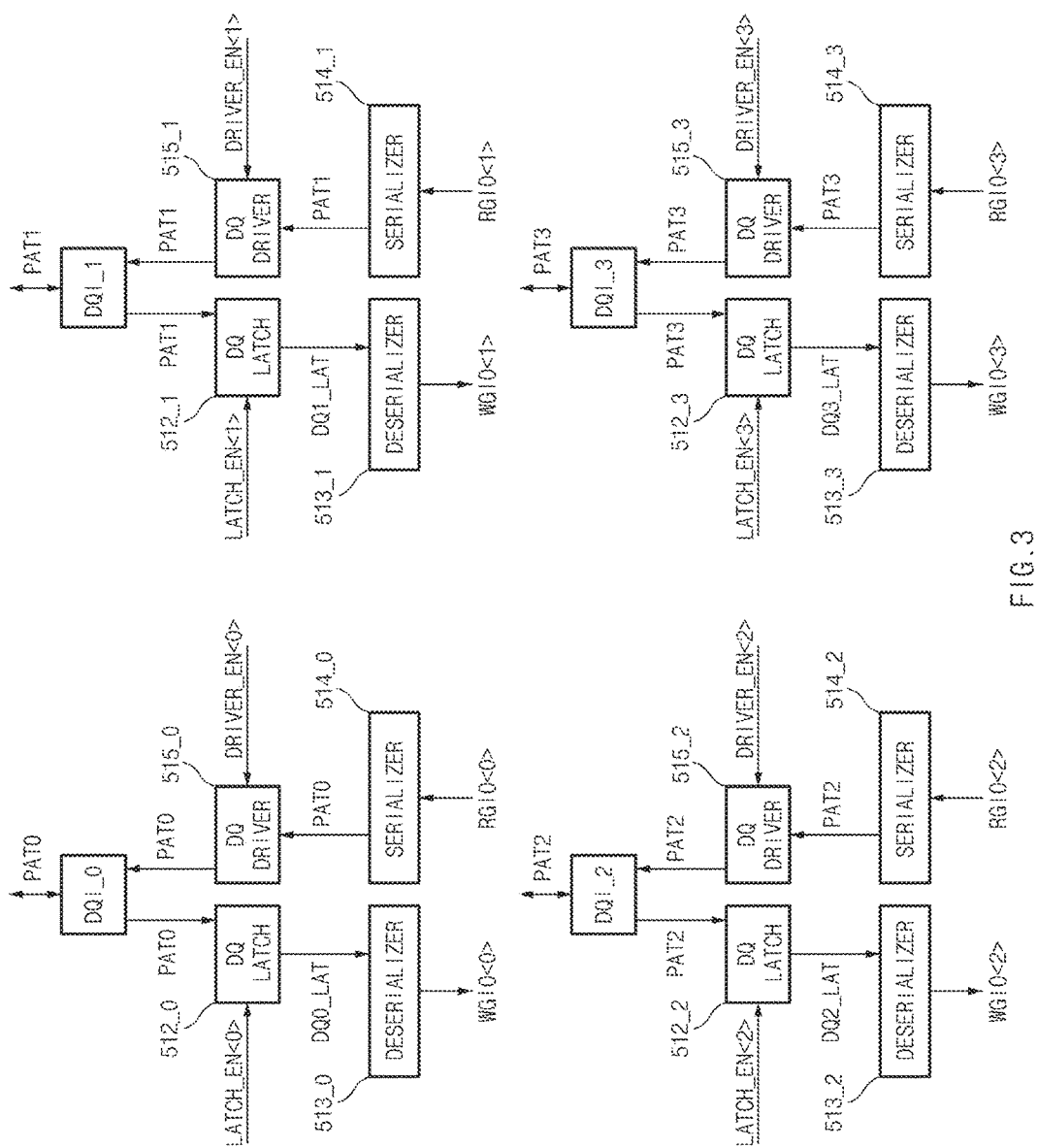
FIG. 3 is a diagram illustrating a part of components included in each chip of FIG. 2.

FIG. 3 is a diagram illustrating components included in each of the chips CHIP0 to CHIP3 of FIG. 2. FIG. 3 represents any one of the chips CHIP0 to CHIP3, and each of the chips CHIP0 to CHIP3 may include the components of FIG. 3.

As described above, each of the chips CHIP0 to CHIP3 may include one or more internal DQ terminals DQI_0 to DQI_3. At this time, DQI_0 represents DQI0_0, DQI1_0, DQI2_0, and DQI3_0 of FIG. 2, DQI_1 represents DQI0_1, DQI1_1, DQI2_1, and DQI3_1 of FIG. 2, DQI_2 represents DQI0_2, DQI1_2, DQI2_2, and DQI3_2 of FIG. 2, and DQI_3 represents DQI0_3, DQI1_3, DQI2_3, and DQI3_3 of FIG. 2.

Referring to FIG. 3, the internal DQ terminals DQI_0 to DQI_3 are configured to transmit or receive the DQ signals DQ0 to DQ3, respectively. Specifically, the internal DQ terminals DQI_0 to DQI_3 are connected to DQ latches 512_0 to 512_3, deserializers 513_0 to 513_3, serializers 514_0 to 514_3, and DQ drivers 515_0 to 515_3, respectively. The DQ latches 512_0 to 512_3 generate DQ latch signals DQ0_LAT to DQ3_LAT by latching the DQ signals DQ0 to DQ3 inputted from the internal DQ terminals DQI_0 to DQI_3, when a latch enable signal LATCH_EN is enabled. The deserializers 513_0 to 513_3 deserialize the DQ latch signals DQ0_LAT to DQ3_LAT and transmit the deserialized signals to write global input/output lines WGIO<0> to WGIO<3>. The serializers 514_0 to 514_3 generate the DQ signals DQ0 to DQ3 by serializing data received from read global input/output lines RGIO<0> to RGIO<3>. The DQ drivers 515_0 to 515_3 output the DQ signals DQ0 to DQ3 received from the serializers 514_0 to 514_3 to the internal DQ terminals DQI_0 to DQI_3 in response to driver enable signals DRIVER_EN<0> to DRIVER_EN<3>.

In FIG. 3, the DQ signals DQ0 to DQ3 transmitted through the internal DQ terminals DQI_0 to DQI_3 or the DQ drivers 515_0 to 515_3 are represented by pattern signals PAT0 to PAT3, respectively. In the present embodiment, the pattern signals PAT0 to PAT3 are used during a training operation. The pattern signals PAT0 to PAT3 and the various control signals LATCH_EN<0:3> and DRIVER_EN<0:3> will be described with reference to FIG. 4.

Figure 4:
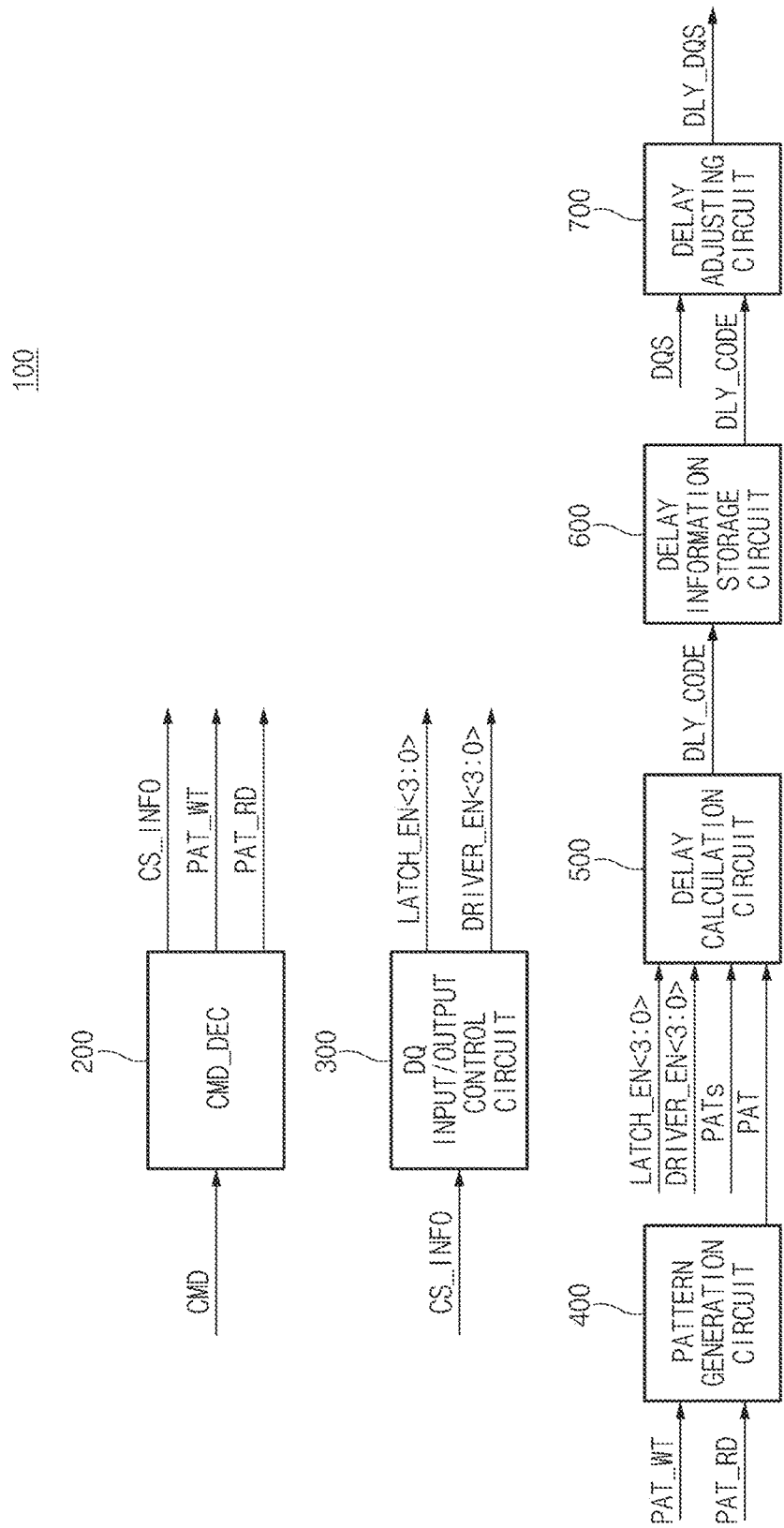
FIG. 4 is a configuration diagram of a training device included in each chip of FIG. 2.

FIG. 4 is a configuration diagram of a training device 100 included in each of the chips CHIP0 to CHIP3 of FIG. 2. The training device 100 of FIG. 4 may be installed in each of the chips CHIP0 to CHIP3.

Referring to FIG. 4, the training device 100 includes a command decoder (CMD_DEC) 200, a DQ input/output control circuit 300, a pattern generation circuit 400, a delay calculation circuit 500, a delay information storage circuit 600, and a delay adjusting circuit 700.

The command decoder 200 decodes the command CMD received from the control device 10.

Specifically, the command decoder 200 generates chip select information CS_INFO, a pattern write command PAT_WT, or a pattern read command PAT_RD by decoding the command CMD received from the control device 10.

The chip select information CS_INFO may be constituted by a plurality of bits, and set differently for each of the chips CHIP0 to CHIP3. For example, the chip select information CS_INFO contained in a chip select command CS_INFO_CMD transmitted to the first chip CHIP0 may be set to "0001", the chip select information CS_INFO contained in the chip select command CS_INFO_CMD transmitted to the second chip CHIP1 may be set to "0010", the chip select information CS_INFO contained in the chip select command CS_INFO_CMD transmitted to the third chip CHIP2 may be set to "0100", and the chip select information CS_INFO contained in the chip select command CS_INFO_CMD transmitted to the fourth chip CHIP3 may be set to "1000".

The DQ input/output control circuit 300 generates the latch enable signals LATCH_EN<3:0> and the driver enable signals DRIVER_EN<3:0>, based on the chip select information CS_INFO.

Specifically, the DQ input/output control circuit 300 enables any one of the plurality of DQ drivers 515_0 to 515_3, and enables the DQ latches which do not correspond to the enabled DQ driver. For example, when the chip select signal CS_INFO<3:0> inputted to the second chip CHIP1 is "0010", the DQ input/output control circuit 300 enables the second driver enable signal DRIVER_EN<1>, and enables the latch enable signals LATCH_EN<0>, LATCH_EN<2>, and LATCH_EN<3>. The DQ input/output control circuit 300 disables the second latch enable signal LATCH_EN<1> and the other driver enable signals DRIVER_EN<0>, DRIVER_EN<2>, and DRIVER_EN<3> which are not enabled. In other words, the DQ input/output control circuit 300 may disable a latch, for example DQ latch 512_1 associated with the DQ terminal DQI1_1, corresponding to the enabled DQ driver, DQ driver 515_1 for example. Further, the DQ input/output control circuit 300 may disable DQ drivers 515_0, 515_2 and 515_3 of the DQ terminals DQI1_0, DQI1_2 and DQI1_3 corresponding to the enabled DQ latches 512_0, 512_2 and 512_3. That is, one of the driver enable signals DRIVER_EN<3:0> is enabled, and the latch enable signals LATCH_EN<3:0> are complementarily enabled with the driver enable signals DRIVER_EN<3:0>.

Therefore, referring to FIGS. 2 and 3, any one of the plurality of internal DQ terminals in each of the chips may be set in a transmittable state, and the other internal DQ terminals may be set in a receivable state. In the above-described example in which the chip select signal CS_INFO<3:0> inputted to the second chip CHIP1 is "0010", the second internal DQ terminal DQI1_1 of the second chip CHIP1 may be set in a transmittable state, and the first internal DQ terminal DQI1_0, the third internal DQ terminal DQI1_2, and the fourth internal DQ terminal DQI1_3 may be set in a receivable state.

As described above, the chip select information CS_INFO is differently set for each of the chips CHIP0 to CHIP3. Thus, which internal DQ terminal is set in a transmittable state and which internal DQ terminal is set in a receivable state are set differently for each of the chips CHIP0 to CHIP3. In the above-described example, because the chip select information CS_INFO inputted to the first chip CHIP0 is "0001", the first internal DQ terminal DQI0_0 of the chip CHIP0 may be set in a transmittable state, and the other internal DQ terminals DQI0_1, DQI0_2, and DQI0_3 may be set in a receivable state. Furthermore, because the chip select information CS_INFO inputted to the third chip CHIP2 is "0100", the third internal DQ terminal DQI2_2 of the third chip CHIP2 may be set in a transmittable state, and the other internal DQ terminals DQI2_0, DQI2_1, and DQI2_3 may be set in a receivable state. Furthermore, because the chip select information CS_INFO inputted to the fourth chip CHIP3 is "1000", the fourth internal DQ terminal DQI3_3 of the fourth chip CHIP3 may be set in a transmittable state, and the other internal DQ terminals DQI3_0, DQI3_1, and DQI3_2 may be set in a receivable state.

In the present embodiment, the reason that different pieces of chip select information CS_INFO are transmitted to the respective chips CHIP0 to CHIP3 and the latch enable signals LATCH_EN<3:0> and the driver enable signals DRIVER_EN<3:0> of the respective chips CHIP0 to CHIP3 are generated according to the chip select information CS_INFO is to set a transmittable internal DQ terminal in each of the chips CHIP0 to CHIP3 differently.

The pattern generation circuit 400 stores a pattern signal PAT having a predetermined number of bits in response to the pattern write command PAT_WT generated from the command decoder 200. For example, the pattern signal PAT<7:0> may be constituted by eight bits, and set to "10000000". The pattern signals PAT stored in the training devices 100 of the respective chips CHIP0 to CHIP3 may have the same value.

The pattern generation circuit 400 outputs the pattern signal PAT in response to the pattern read command PAT_RD generated from the command decoder 200. The pattern signal PAT may be previously stored in the pattern generation circuit 400. At this time, the pattern generation circuit 400 may serialize and output the pattern signal PAT. That is, the pattern generation circuit 400 may serialize the pattern signal PAT<7:0>, and output the serialized pattern signal PAT of "10000000" in a time sequence. The serializer 514 of FIG. 3 may be included in the pattern generation circuit 400. Accordingly, each of the chips CHIP0 to CHIP3 may include a training device 100 which generates and transmits a pattern signal PAT to one or more other chips CHIP0 to CHIP3 in response to the read command PAT_RD.

In the present embodiment, the pattern read command PAT_RD is transmitted to the training devices 100 of the respective chips CHIP0 to CHIP3 at the same time. At this time, the internal DQ terminal which is set differently in a transmittable state for each of the chips CHIP0 to CHIP3, and the other internal DQ terminals excluding the transmittable internal DQ terminal are set in a receivable state. Therefore, in response to the pattern read command PAT_RD, the transmittable internal DQ terminal in each of the chips CHIP0 to CHIP3 outputs the serialized pattern signal PAT, and the other internal DQ terminals receive the serialized pattern signals PAT transmitted from the other chips. This configuration will be described in detail with reference to FIG. 5.

Figure 5:
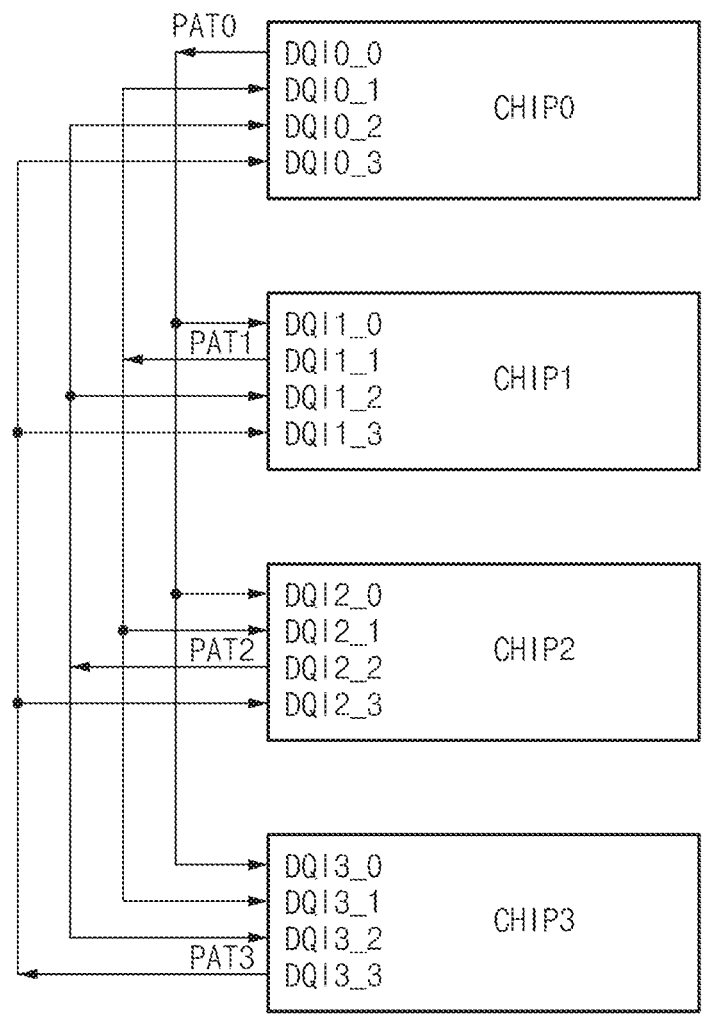
FIG. 5 is a diagram illustrating inputs/outputs of serialized pattern signals between the chips when a pattern read command is inputted to the semiconductor device of FIG. 2.

FIG. 5 is a diagram illustrating the input/output of the serialized pattern signals PAT among the chips CHIP0 to CHIP3 when the pattern read command PAT_RD is inputted to the semiconductor device 20 of FIG. 2, that is, inputted to the training devices 100 of the respective chips CHIP0 to CHIP3. FIG. 5 illustrates the above-described example in which the first internal DQ terminal DQI0_0 of the first chip CHIP0 is set in a transmittable state, the second internal DQ terminal DQI1_1 of the second chip CHIP1 is set in a transmittable state, the third internal DQ terminal DQI2_2 of the third chip CHIP2 is set in a transmittable state, the fourth internal DQ terminal DQI3_3 of the fourth chip CHIP3 is set in a transmittable state, and the other internal DQ terminals are all set in a receivable state.

FIG. 5 shows that, in the first chip CHIP0, the pattern signal PAT0 is read from the first internal DQ terminal DQI0_0, and inputted to the first internal DQ terminals DQI1_0, DQI2_0, and DQI3_0 of the other chips CHIP1, CHIP2 and CHIP3. In the second chip CHIP1, the pattern signal PAT1 is read from the second internal DQ terminal DQI1_1, and inputted to the second internal DQ terminals DQI0_1, DQI2_1, and DQI3_1 of the other chips CHIP0, CHIP2, and CHIP3. In the third chip CHIP2, the pattern signal PAT2 is read from the third internal DQ terminal DQI2_2, and inputted to the third internal DQ terminals DQI0_2, DQI1_2, and DQI3_2 of the other chips CHIP0, CHIP1, and CHIP3. In the fourth chip CHIP3, the pattern signal PAT3 is read from the fourth internal DQ terminal DQI3_3, and inputted to the fourth internal DQ terminals DQI0_3, DQI1_3, and DQI2_3 of the other chips CHIP0, CHIP1, and CHIP2.

That is, when the control device 10 generates and transmits the pattern read command PAT_RD to the pattern generation circuits 400 of the training devices 100 in the respective chips CHIP0 to CHIP3, the training devices 100 of the chips CHIP0 to CHIP3 may transmit the pattern signals PAT0 to PAT3 through specific internal DQ terminals which are set differently for the respective chips CHIP0 to CHIP3, and receive the pattern signals generated by the other training devices 100 through the other DQ terminals.

Next, referring to FIGS. 4, 6A, 6B, and 7, the delay calculation circuit 500 will be described.

The delay calculation circuit 500 determines a delay increase signal INC_DLY or delay lock signal LOCK_DLY by comparing the timing of the pattern signal PAT generated through the corresponding chip to the timings of the pattern signals PATs received from the other chips. The pattern signal PAT generated through the chip in FIG. 4 represents the pattern signal PAT0 in the chip CHIP0, the pattern signal PAT1 in the second chip CHIP1, the pattern signal PAT2 in the third chip CHIP2, and the pattern signal PAT3 in the fourth chip CHIP3. Furthermore, the pattern signals PATs received from the other chips represent the pattern signals PAT1, PAT2, and PAT3 in the first chip CHIP0, the pattern signals PAT0, PAT2, and PAT3 in the second chip CHIP1, the pattern signals PAT0, PAT1, and PAT3 in the third chip CHIP2, and the pattern signals PAT0, PAT1, and PAT2 in the fourth chip CHIP3.

For example, when the timing of the pattern signal PAT generated through the corresponding chip is later than the timings of the pattern signals PATs inputted from the other chips, the delay calculation circuit 500 enables the delay lock signal LOCK_DLY. On the other hand, when the timing of the pattern signal PAT generated through the corresponding chip is earlier than one or more of the timings of the pattern signals PATs inputted from the other chips, the delay calculation circuit 500 enables the delay increase signal INC_DLY.

Figure 6A:
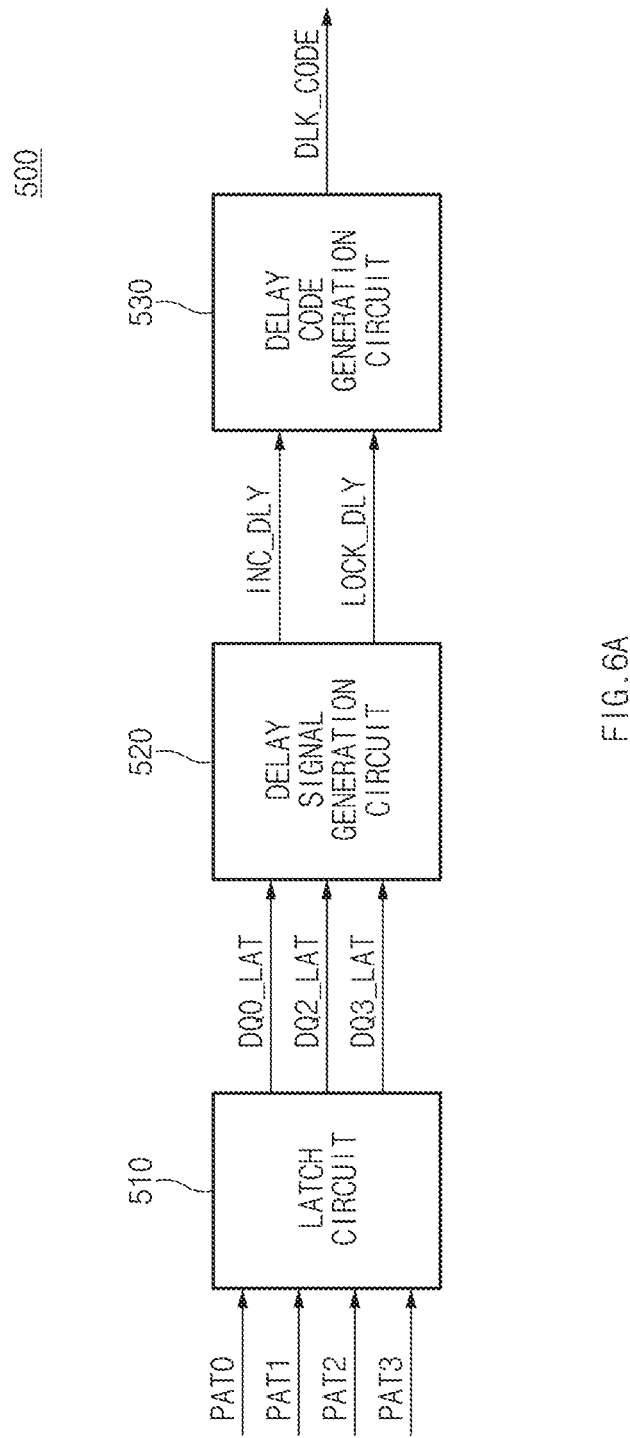
FIG. 6A is a detailed configuration diagram of a delay calculation circuit of FIG. 4.

FIG. 6A is a configuration diagram of the delay calculation circuit 500 that performs the above-described operation.

Referring to FIG. 6A, the delay calculation circuit 500 includes a latch circuit 510, a delay signal generation circuit 520, and a delay code generation circuit 530. The latch circuit 510 generates the DQ latch signals DQ0_LAT, DQ2_LAT, and DQ3_LAT by latching the pattern signals PAT0, PAT2, and PAT3 generated by the other chips at a rising edge of the pattern signal PAT1 generated through the corresponding chip. The delay signal generation circuit 520 generates the delay increase signal INC_DLY or the delay lock signal LOCK_DLY by comparing the DQ latch signals DQ0_LAT, DQ2_LAT, and DQ3_LAT and the pattern signal PAT1 generated through the corresponding chip. The delay code generation circuit 530 generates a delay code DLY_CODE based on the delay increase signal INC_DLY and the delay lock signal LOCK_DLY.

Figure 6B:
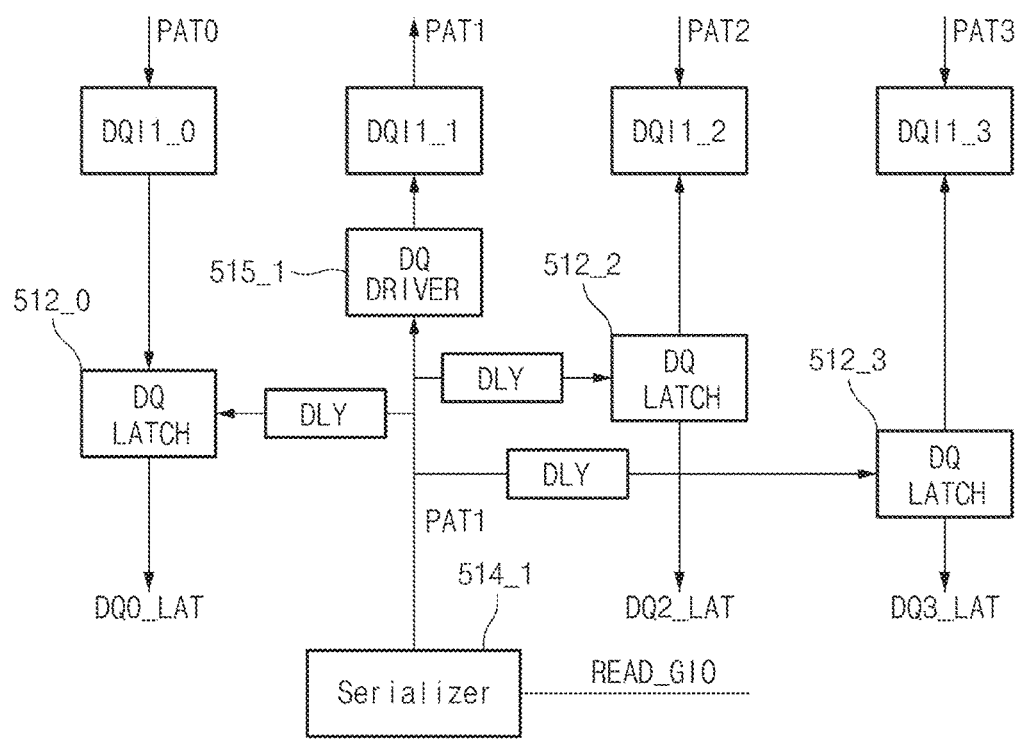
FIG. 6B is a diagram for describing a latch circuit of FIG. 6A.

FIG. 6B is a diagram for describing the latch circuit 510 of FIG. 6A, illustrating the signals of the second chip CHIP1 in the example of FIG. 5.

FIG. 6B shows that, in the second chip CHIP1, the pattern signal PAT0 transmitted from the first chip CHIP0 is inputted to the first internal DQ terminal DQI1_0, the pattern signal PAT2 transmitted from the third chip CHIP2 is inputted to the third internal DQ terminal DQI1_2, and the pattern signal PAT3 transmitted from the fourth chip CHIP3 is inputted to the fourth internal DQ terminal DQI1_3. Furthermore, the pattern generation circuit 400 of the second chip CHIP1 generates the pattern signal PAT1 which is to be transmitted to the other chips CHIP0, CHIP2 and CHIP3. For convenience of description, FIG. 6B does not illustrate the DQ latch 512_1 and the DQ drivers 515_0, 515_2, and 515_3 which are not enabled.

The latch circuit 510 may include the DQ latches 512_0, 512_2, and 512_3 of FIG. 6B. The first DQ latch 512_0 generates the first DQ latch signal DQ0_LAT by latching the pattern signal PAT0 received from the first chip CHIP0 based on the pattern signal PAT1 outputted from the serializer 514_1 serving as a part of the pattern generation circuit 400 in FIG. 4. At this time, a predetermined delay time is required until the pattern signal PAT0 is generated by the training device 100 of the first chip CHIP0 and reaches the first DQ latch 512_0. Therefore, the pattern signal PAT1 which is delayed by a predetermined time in consideration of the predetermined delay time may be provided to the first DQ latch 512_0.

The third DQ latch 512_2 generates the third DQ latch signal DQ2_LAT by latching the pattern signal PAT2 received from the third chip CHIP2 based on the pattern signal PAT1 outputted from the serializer 514_1. At this time, in consideration of a delay time which is required until the pattern signal PAT2 is generated by the training device 100 included in the third chip CHIP2 and reaches the third DQ latch 512_2, the pattern signal PAT1 may be delayed by a predetermined time and then provided to the third DQ latch 512_2.

The fourth DQ latch 512_3 generates the fourth DQ latch signal DQ3_LAT by latching the pattern signal PAT3 received from the fourth chip CHIP3 based on the pattern signal PAT1 outputted from the serializer 514_1. At this time, in consideration of a delay time which is required until the pattern signal PAT3 is generated by the training device 100 included in the fourth chip CHIP3 and reaches the fourth DQ latch 512_3, the pattern signal PAT1 may be delayed by a predetermined time and then provided to the fourth DQ latch 512_3. The delays of the pattern signals PAT1 provided to the first DQ latch 512_0, the third DQ latch 512_2, and the fourth DQ latch 512_3, respectively, may be different from each other.

The delay signal generation circuit 520 generates the delay lock signal LOCK_DLY or the delay increase signal INC_DLY based on the DQ latch signals DQ0_LAT, DQ2_LAT, and DQ3_LAT. For example, the delay signal generation circuit 520 enables the delay lock signal LOCK_DLY when all of the DQ latch signals DQ0_LAT, DQ2_LAT, and DQ3_LAT are at a high level. Otherwise, the delay signal generation circuit 520 enables the delay increase signal INC_DLY. The delay lock signal LOCK_DLY and the delay increase signal INC_DLY may be complementarily enabled.

Figure 7A:
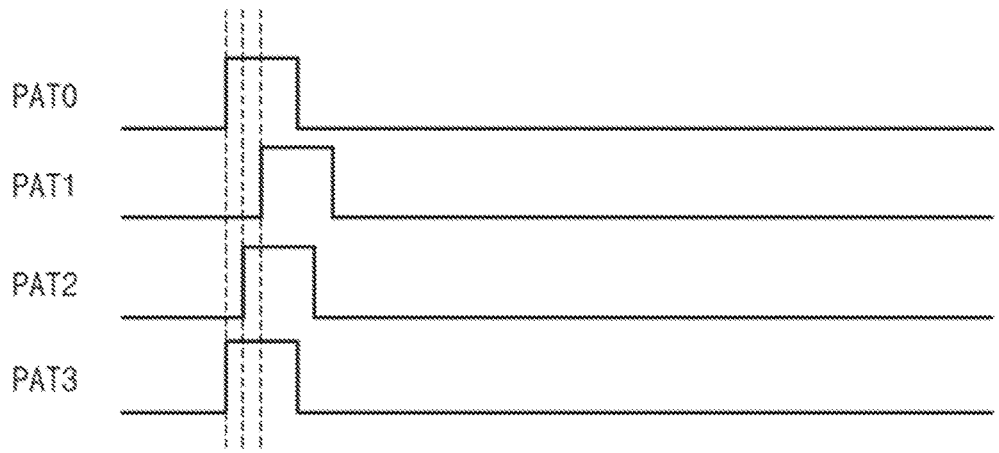
FIGS. 7A to 7C are timing diagrams for describing the operations of the latch circuit and a delay signal generation circuit of FIGS. 6A and 6B.
Figure 7B:
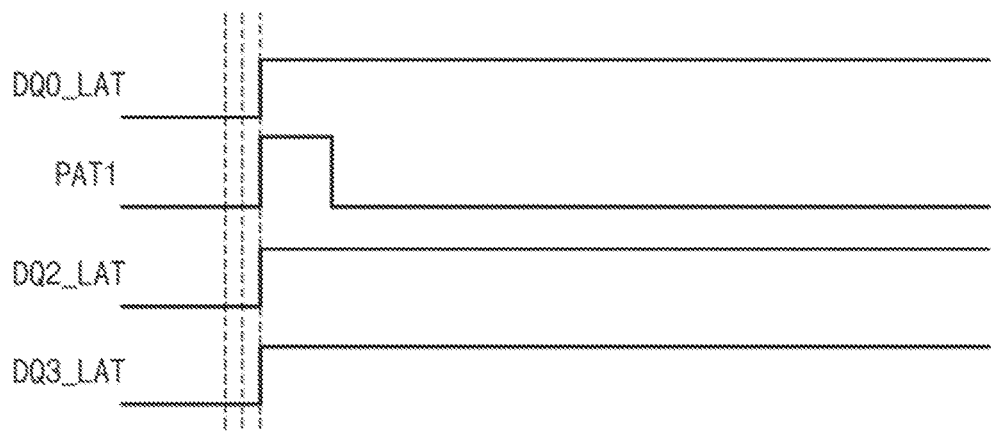
Figure 7C:
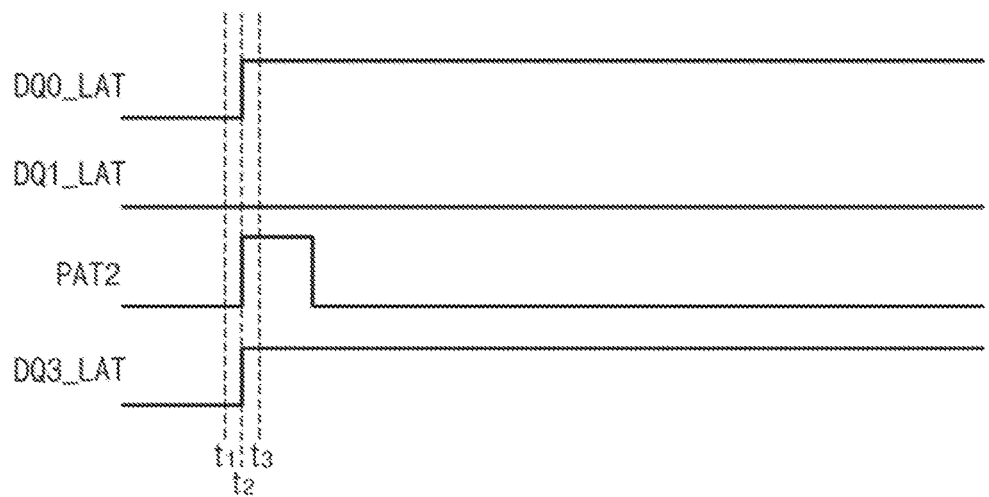

FIGS. 7A to 7C are timing diagrams for describing the operations of the latch circuit 510 and the delay signal generation circuit 520 of FIG. 6A.

FIG. 7A is a timing diagram of the pattern signals PAT0 to PAT3 outputted from the respective chips CHIP0 to CHIP3 before a training operation is performed. In the present embodiment, the pattern signals PAT0 to PAT3 are serialized signals having a value of "10000000" in a time sequence.

Referring to FIG. 7A, the generation timing of the pattern signal PAT0 outputted from the first chip CHIP0 is t1, the generation timing of the pattern signal PAT1 outputted from the second chip CHIP1 is t3, the generation timing of the pattern signal PAT2 outputted from the third chip CHIP2 is t2, and the generation timing of the pattern signal PAT3 outputted from the fourth chip CHIP3 is t1. Accordingly, the delay amount is used to equalize or lag the generation timing of the pattern signal PAT0 to PAT3 generated by a corresponding training device to or behind the generation timings of the pattern signals PAT0 to PAT3 generated by the other training devices. At this time, although FIG. 7 is based on the generation timings of the pattern signals PAT0 to PAT3, the timings of the pattern signals PAT0 to PAT3 may be determined according to the points of time that the pattern signals PAT0 to PAT3 reach the latch circuit 510. Therefore, a delay time required until the pattern signals PAT0 to PAT3 are generated and reach the latch circuit 510 may be considered.

FIG. 7B is a timing diagram illustrating a latch result of the latch circuit 510 in the second chip CHIP1 based on the second pattern signal PAT1.

Referring to FIG. 7B, the latch circuit 510 of the second chip CHIP1 generates the DQ latch signals DQ0_LAT, DQ2_LAT, and DQ3_LAT by latching the other pattern signals PAT0, PAT2, and PAT3 based on a rising edge of the second pattern signal PAT1, that is, t3. Specifically, the latch circuit 510 of the second chip CHIP1 retains the DQ latch signals DQ0_LAT, DQ2_LAT, and DQ3_LAT at a low level before t3, determines the levels of the pattern signals PAT0, PAT2, and PAT3 at t3, and changes the DQ latch signals DQ0_LAT, DQ2_LAT, and DQ3_LAT to a high level when the pattern signals PAT0, PAT2 and PAT3 are at a high level, or retains the DQ latch signals DQ0_LAT, DQ2_LAT, and DQ3_LAT at a low level when the pattern signals PAT0, PAT2, and PAT3 are at a low level. In FIG. 6B, because all of the pattern signals PAT0, PAT2, and PAT3 are at a high level based on t3, the latch circuit 510 of the second chip CHIP1 changes the DQ latch signals DQ0_LAT, DQ2_LAT, and DQ3_LAT to a high level.

When all of the DQ latch signals DQ0_LAT, DQ2_LAT, and DQ3_LAT are at a high level, the delay signal generation circuit 520 enables the delay lock signal LOCK_DLY. Because all of the DQ latch signals DQ0_LAT, DQ0_LAT, and DQ3_LAT are at a high level in FIG. 7B, the delay signal generation circuit 520 in the second chip CHIP1 does not adjust the delay any more, but locks the delay to the initial value.

FIG. 7C is a timing diagram illustrating a latch result of the latch circuit 510 in the third chip CHIP2 based on the third pattern signal PAT2.

Referring to FIG. 7C, the latch circuit 510 of the third chip CHIP2 generates the DQ latch signals DQ0_LAT, DQ1_LAT, and DQ3_LAT by latching the other pattern signals PAT0, PAT1, and PAT3 based on a rising edge of the third pattern signal PAT2, that is, t2. Specifically, the latch circuit 510 of the third chip CHIP2 retains the DQ latch signals DQ0_LAT, DQ1_LAT, and DQ3_LAT at a low level before t2, and changes the DQ latch signals DQ0_LAT and DQ3_LAT to a high level at t2 because the pattern signals PAT0 and PAT3 are at a high level. Furthermore, because the pattern signal PAT1 is at a low level at t2, the latch circuit 510 retains the DQ latch signal DQ1_LAT at a low level.

The delay signal generation circuit 520 of the third chip CHIP2 enables the delay increase signal INC_DLY because all of the DQ latch signals DQ0_LAT, DQ1_LAT, and DQ3_LAT of the pattern signals PAT0, PAT1, and PAT3 received from the other chips CHIP0, CHIP1, and CHIP3 are not at a high level (at least one of the DQ latch signals DQ0_LAT, DQ1_LAT, and DQ3_LAT is at a low level).

Next, the delay code generation circuit 530 will be described with reference to FIGS. 6A, 8A and 8B.

Referring back to FIG. 6A, the delay code generation circuit 530 generates the delay code DLY_CODE indicating the delay amount, based on at least one of the delay lock signal LOCK_DLY and the delay increase signal INC_DLY. For example, the delay code generation circuit 530 may increase an internal counter when the delay increase signal INC_DLY is enabled, or convert the internal counter value into the delay code DLY_CODE when the delay lock signal LOCK_DLY is enabled. Further, the delay code generation circuit 530 may generate the delay code DLY_CODE based on a value of the internal counter in response to the delay lock signal LOCK_DLY. Thus, the delay calculation circuit 500 may calculate the delay amount based on comparison results between the generation timing of a pattern signal and generation timings of pattern signals which are generated from one or more training devices and transmitted to a corresponding training device.

Figure 8A:
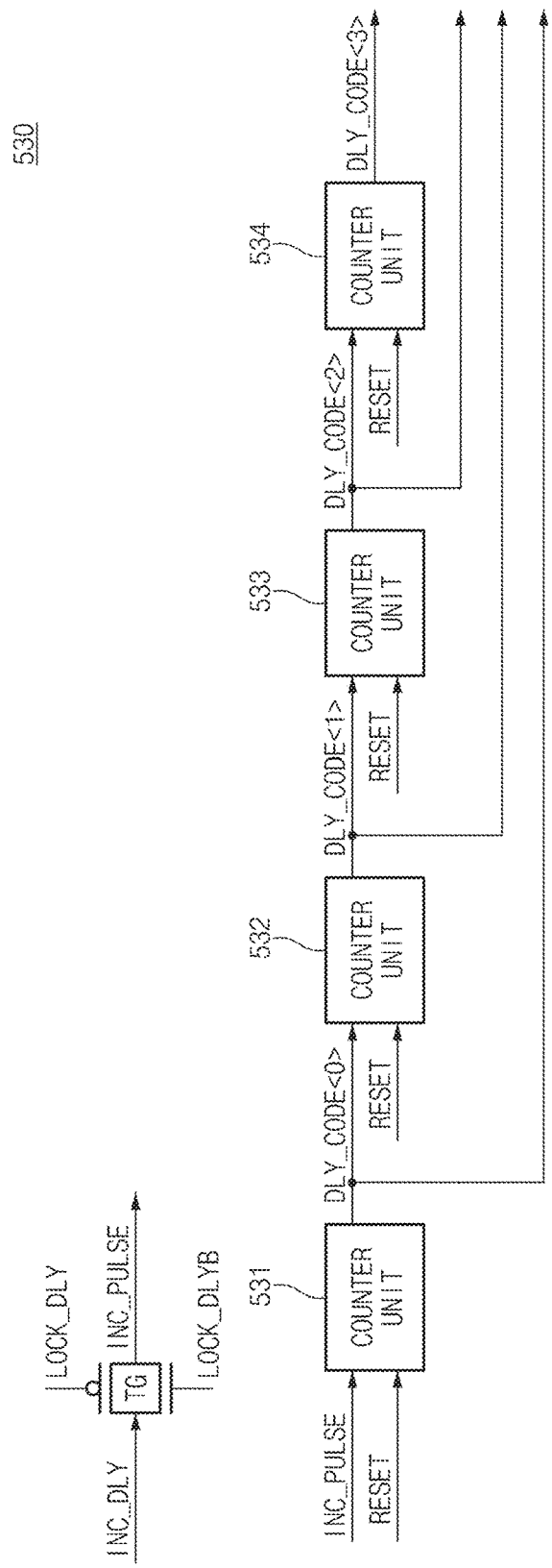
FIG. 8A is a detailed configuration diagram of a delay code generation circuit of FIG. 7.

FIG. 8A is a detailed configuration diagram of the delay code generation circuit 530 of FIG. 7. FIG. 8B is a circuit diagram of a counter unit 531 of FIG. 8A.

Referring to FIG. 8A, the delay code generation circuit 530 includes a transfer gate TG and a plurality of counter units 531 and 534.

The transfer gate TG generates an increase pulse signal INC_PULSE based on the delay lock signal LOCK_DLY and the delay increase signal INC_DLY. Specifically, when the delay lock signal LOCK_DLY is disabled, the transfer gate TG generates the increase pulse signal INC_PULSE based on the delay increase signal INC_DLY. In FIG. 8A, an inverted delay lock signal LOCK_DLYB is an inverted signal of the delay lock signal LOCK_DLY.

The counter units 531 to 534 are connected in a chain shape, the counter unit 531 at the head of the chain receives the increase pulse signal INC_PULSE, and an output of each of the counter units 531 to 533 becomes an input of the next counter unit. The outputs of the counter units 531 to 534 constitute the respective bits of the delay code DLY_CODE<0:3>.

Figure 8B:
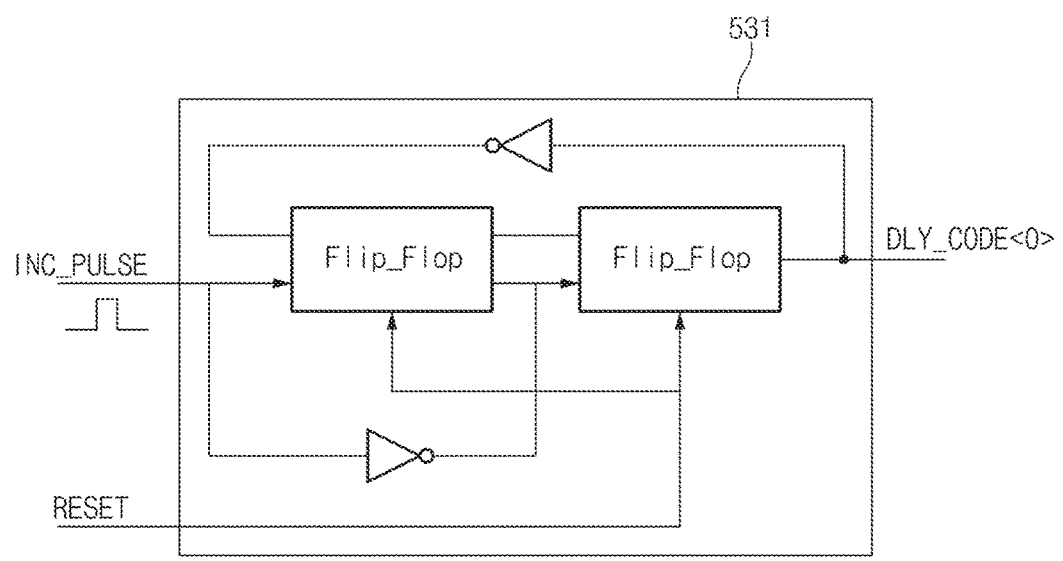
FIG. 8B is a circuit diagram of a counter unit of FIG. 8A.

FIG. 8B is a detailed circuit diagram of the counter unit 531 representative of the counter units 531 to 534. In FIG. 8B, the counter unit 531 receives the increase pulse signal INC_PULSE, and outputs the delay code DLY_CODE<0>. However, when the delay code DLY_CODE<0> is inputted and the delay code DLY_CODE<1> is outputted, the counter unit 532 may be applied. By changing only the input/output signals, the counter units 533 and 534 may be applied.

Referring to FIG. 8B, the counter unit 531 includes first and second flip-flops. The first flip-flop receives the increase pulse signal INC_PULSE and an inverted signal of the delay code DLY_CODE<0> corresponding to an output signal, and the second flip-flop receives the output signal of the first flip-flop and an inverted signal of the increase pulse signal INC_PULSE. According to this configuration, the counter unit 531 inverts the level of the delay code DLY_CODE<0> when the increase pulse signal INC_PULSE is inputted a predetermined number of times. In FIGS. 8A and 8B, a reset signal RESET may be enabled when the chip select information CS_INFO is inputted from the command decoder 200, for example.

Referring back to FIG. 4, the delay information storage circuit 600 stores the delay code DLY_CODE therein. The delay information storage circuit 600 may include a non-volatile memory such as an E-fuse to store the delay code DLY_CODE, and provide the stored delay code to the delay adjusting circuit 700 later.

The delay adjusting circuit 700 adjusts the delay of the DQ signal outputted from the corresponding training device 100 of FIG. 4, based on the delay code DLY_CODE. As illustrated in FIG. 4, the delay adjusting circuit 700 may generate the delay DQS signal DLY_DQS by delaying the DQS signal by a delay amount corresponding to the delay code DLY_CODE, for example.

FIG. 9 is a diagram illustrating the delay adjusting circuit 700, when the delay code DLY_CODE is constituted by three bits. In FIG. 9, the inverted delay codes DLY_CODEB<0> to DLY_CODEB<2> are inverted signals of the delay codes DLY_CODE<0> to DLY_CODE<2>.

Referring to FIG. 9, the delay adjusting circuit 700 is configured to pass the DQS signal DQS through inverter gates controlled by the respective bits of the delay code DLY_CODE. At this time, a large number of inverters may be connected to the MSB of the delay code DLY_CODE, such that a larger amount of delay is applied. That is, four inverters may be connected to the delay code DLY_CODE<2> such that the DQS signal DQS is delayed by a delay amount four times larger than the unit time, and two inverters may be connected to the delay code DLY_CODE<1> such that the DQS signal DQS is delayed by a delay amount four times larger than the unit time. Furthermore, no inverters may be connected to the delay code DLY_CODE<0>, but only a transfer gate may be connected to the delay code DLY_CODE<0>.

Figure 10A:
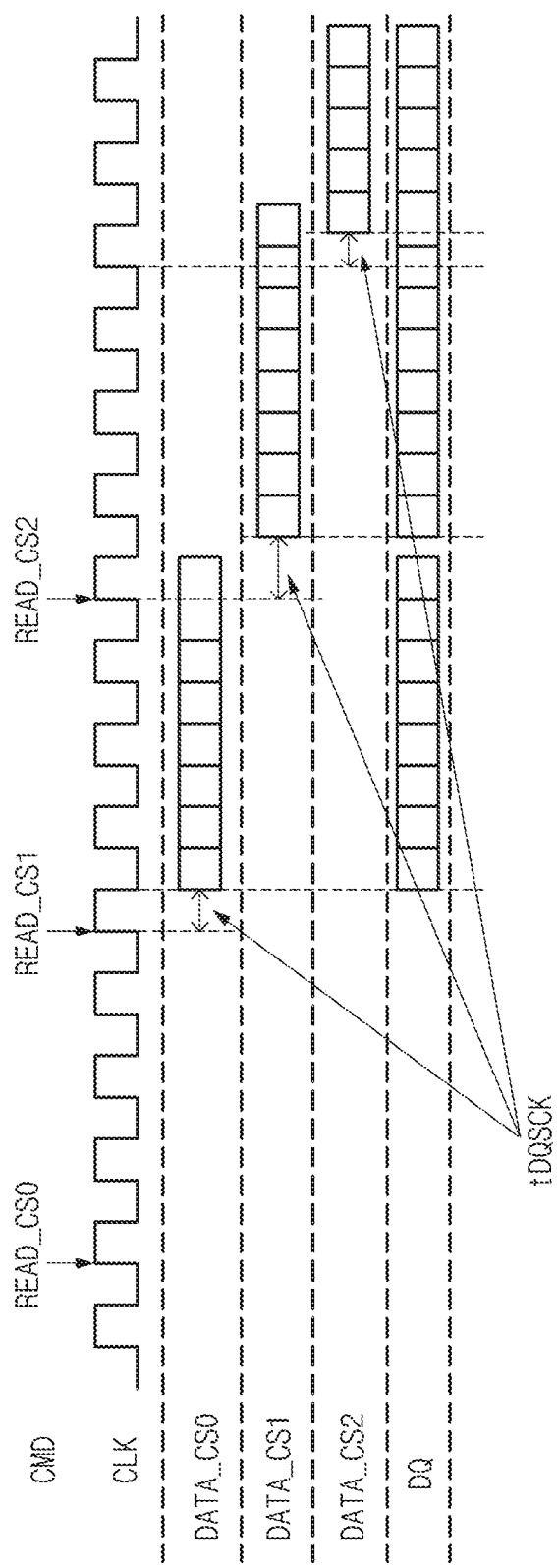
FIG. 10A is a timing diagram of data output according to the related art.
Figure 10B:
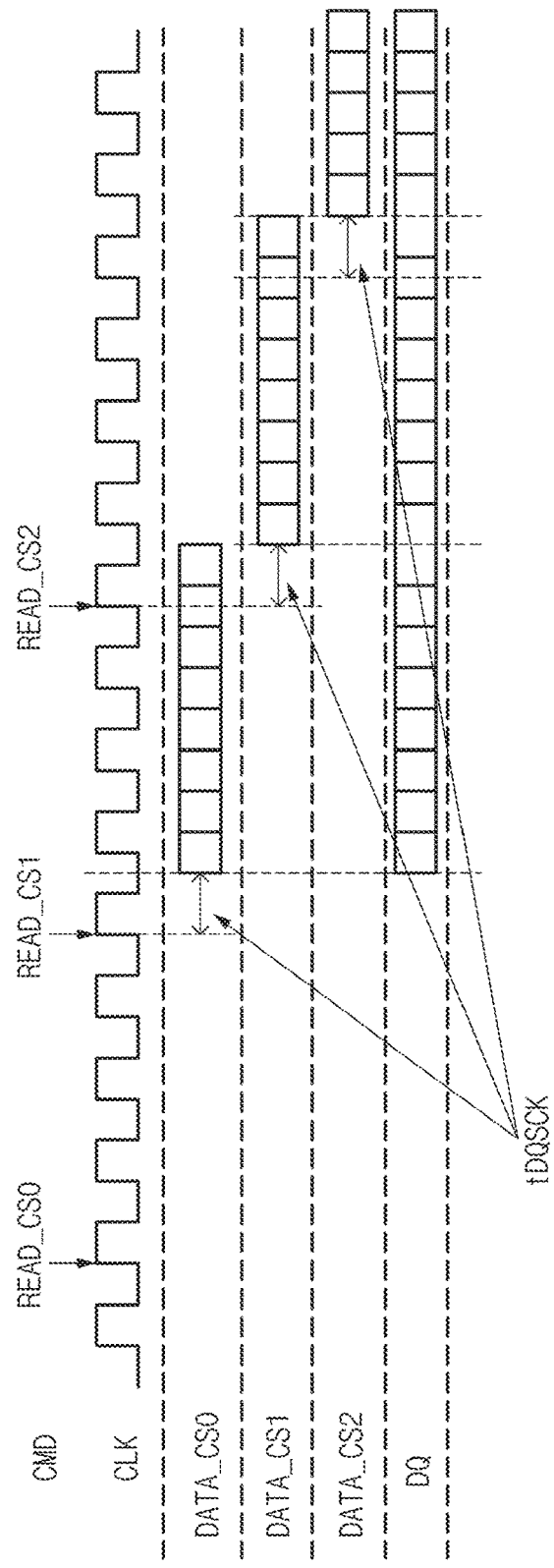
FIG. 10B is a timing diagram of data output according to a present embodiment.

FIG. 10B is a timing diagram of data output when the training operation according to the present embodiment is performed.

Referring to FIG. 10B, delays tDQSCK0 to tDQSCK2 of data DATA_CS0 to DATA_CS2 of the respective chips CS0 to CS2 are equal to each other. The delay tDQSCK may be a delay between the clock signal CLK and the data DQ. Accordingly, the delay time of the DQ signal may be tDQSCK. Thus, when the data DATA_CS0 to DATA_CS2 of the respective chips CS0 to CS2 are outputted through the same external DQ terminal, no read bubbles occur in the DQ signal, which makes it possible to prevent a data error.

According to the present embodiments, the training device and the semiconductor system including the same can adjust a delay difference during data transmission between the plurality of chips, thereby preventing a data error.

While certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

The configuration of active high or low level for indicating an active state of a signal or circuit may be changed depending on embodiments. That is, the configurations of PMOS transistor and NMOS transistor may replace each other, and various transistors may be used to implement the configurations, if necessary. Since the change of the circuit has a large number of cases and can be easily inferred by any one which is skilled in the art, the enumerations thereof are omitted herein.

What is claimed is:
1. A training device comprising:
 a pattern generation circuit configured to generate a pattern signal in response to a read command;
 a delay calculation circuit configured to calculate a delay amount based on comparison results between a generation timing of the pattern signal and generation timings of pattern signals which are generated from one or more other training devices and transmitted to a corresponding training device;
 a delay information storage circuit configured to store the delay amount calculated by the delay calculation circuit; and
 a delay adjusting circuit configured to adjust a delay of a DQ signal in a chip including the corresponding training device, based on the delay amount stored in the delay information storage circuit.

2. The training device of claim 1, wherein the delay amount is used to equalize or lag the generation timing of the pattern signal generated by the corresponding training device to or behind the generation timings of the pattern signals generated by the other training devices.

3. The training device of claim 1, further comprising an input/output control circuit configured to enable a DQ driver of a DQ terminal in the corresponding chip, the DQ terminal transmitting the pattern signal generated by the corresponding training device, and enable DQ latches of DQ terminals in the corresponding chip, the DQ terminals receiving the pattern signals generated from the other training devices.

4. The training device of claim 3, wherein the input/output control circuit disables a DQ latch of the DQ terminal corresponding to the enabled DQ driver, and disables DQ drivers of the DQ terminals corresponding to the enabled DQ latches.

5. The training device of claim 3, wherein the input/output control circuit selects the DQ terminal from among a plurality of DQ terminals included in the corresponding chip, based on chip select information, and enables the DQ driver associated with the DQ terminal.

6. The training device of claim 1, wherein the pattern signal generated by the corresponding training device is previously stored in the pattern generation circuit in response to a pattern write command.

7. The training device of claim 1, wherein the pattern signal generated by the corresponding training device has a pattern of one or more consecutive low levels following one or more consecutive high levels.

8. The training device of claim 1, wherein the delay calculation circuit comprises:
  a delay signal generation circuit configured to generate a delay increase signal when the generation timing of the pattern signal generated by the corresponding training device is earlier than any one of the generation timings of the pattern signals generated by the other training devices, and generate a delay lock signal when the generation timing of the pattern signal generated by the corresponding training device is equal to or later than all of the generation timings of the pattern signals generated by the other training devices; and
  a delay code generation circuit configured to generate a delay code corresponding to the delay amount, based on the delay increase signal and the delay lock signal.

9. The training device of claim 8, wherein the delay calculation circuit further comprises a latch circuit configured to latch the pattern signals generated by the other training devices at a rising edge of the pattern signal generated by the corresponding training device.

10. The training device of claim 9, wherein the delay signal generation circuit enables the delay lock signal when all of the latched pattern signals are at a high level.

11. The training device of claim 9, wherein the delay signal generation circuit enables the delay increase signal when any one of the latched pattern signals is at a low level.

12. The training device of claim 8, wherein the delay code generation circuit increases an internal counter in response to the delay increase signal, and generates the delay code based on the value of the counter in response to the delay lock signal.

13. The training device of claim 1, wherein the delay of the DQ signal is tDQSCK.

14. A semiconductor system comprising:
  a control device configured to generate a read command; and
  a semiconductor device comprising a plurality of chips to which a plurality of DQ lines are connected in common,
  wherein each of the chips comprises a training device configured to generate and transmit a pattern signal to one or more other chips in response to the read command, calculate a delay amount based on comparison results between a generation timing of the pattern signal generated by the corresponding chip and generation timings of pattern signals which are generated by the other chips, and adjust delays of DQ signals transmitted from the other chips, based on the delay amount.

15. The semiconductor system of claim 14, wherein the control device transmits different pieces of chip select information to the respective chips of the semiconductor device, and
  each of the chips of the semiconductor device determines a DQ terminal to transmit the pattern signal, based on the transmitted chip select information.

16. The semiconductor system of claim 15, wherein each of the chips of the semiconductor device enables a DQ driver of the DQ terminal to transmit the pattern signal and disables a DQ latch of the DQ terminal, and disables DQ drivers of the other DQ terminals and enables DQ latches of the other DQ terminals, among the DQ terminals of the chip.

17. The semiconductor system of claim 15, wherein the plurality of chips of the semiconductor device transmits the pattern signals generated by the respective chips through different DQ terminals.

18. The semiconductor system of claim 14, wherein each of the training devices of the semiconductor device comprises:
  a pattern generation circuit configured to generate the pattern signal in response to the read command;
  a delay calculation circuit configured to calculate the delay amount based on the comparison results between the generation timing of the pattern signal and the generation timings of the pattern signals which are generated from one or more other training devices and transmitted to the corresponding training device; and
  a delay adjusting circuit configured to adjust a delay of a DQ signal in the chip including the corresponding training device, based on the delay amount.

19. The training device of claim 18, further comprising a delay information storage circuit configured to store the delay amount calculated by the delay calculation circuit.

20. A semiconductor system comprising:
  a control device configured to generate a read command; and
  a semiconductor device comprising a plurality of chips to which a plurality of DQ lines are connected in common,
  wherein each of the chips comprises a training device configured to generate and transmit a pattern signal to one or more other chips in response to the read command, calculate a delay amount based on comparison results between a generation timing of the pattern signal generated by the corresponding chip and generation timings of pattern signals which are generated by the other chips, and adjust delays of DQ signals transmitted from the other chips, based on the delay amount,
  wherein the delay amount is used to equalize or lag the generation timing of the pattern signal generated by the corresponding training device to or behind the generation timings of the pattern signals generated by the other chips.

* * * * *